(12) United States Patent
Jung et al.

(10) Patent No.: US 7,606,097 B2
(45) Date of Patent: Oct. 20, 2009

(54) ARRAY SENSE AMPLIFIERS, MEMORY DEVICES AND SYSTEMS INCLUDING SAME, AND METHODS OF OPERATION

(75) Inventors: Chulmin Jung, Boise, ID (US); Tae Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 11/646,735

(22) Filed: Dec. 27, 2006

(65) Prior Publication Data
US 2008/0159035 A1 Jul. 3, 2008

(51) Int. Cl.
G11C 7/02 (2006.01)
(52) U.S. Cl. ............... 365/207; 365/205; 365/196; 365/204; 365/203
(58) Field of Classification Search ............ 365/207, 365/205, 196, 204, 203
See application file for complete search history.

(56) References Cited

U.S. PATENT DOCUMENTS

| | | | | |
|---|---|---|---|---|
| 4,054,865 A | 10/1977 | Shirato | ............... | 340/173 R |
| 4,096,401 A | 6/1978 | Hollingsworth | ............... | 307/355 |
| 4,239,994 A | 12/1980 | Stewart | ............... | 307/359 |
| 4,375,600 A | 3/1983 | Wu | ............... | 307/530 |
| 4,460,985 A | 7/1984 | Hoffman | ............... | 365/207 |
| 4,509,147 A * | 4/1985 | Tanimura et al. | ............... | 365/190 |
| 4,535,259 A | 8/1985 | Smarandoiu et al. | ............... | 307/530 |
| 4,625,300 A | 11/1986 | McElroy | ............... | 365/205 |
| 4,644,197 A * | 2/1987 | Flannagan | ............... | 365/190 |
| 4,791,324 A * | 12/1988 | Hodapp | ............... | 365/207 |
| 5,053,998 A | 10/1991 | Kannan et al. | ............... | 365/194 |
| 5,065,367 A | 11/1991 | Kondou | ............... | 365/208 |
| 5,220,221 A | 6/1993 | Casper | ............... | 307/530 |
| 5,255,231 A | 10/1993 | Oh | ............... | 365/202 |
| 5,309,047 A * | 5/1994 | Tiede et al. | ............... | 327/52 |
| 5,349,302 A | 9/1994 | Cooper | ............... | 365/207 |
| 5,422,854 A | 6/1995 | Hirano et al. | ............... | 365/210 |
| 5,455,802 A | 10/1995 | McClure | ............... | 365/233 |
| 5,585,747 A * | 12/1996 | Proebsting | ............... | 365/189.11 |
| 5,627,494 A | 5/1997 | Somerville | ............... | 330/257 |
| 5,768,201 A | 6/1998 | Oh | ............... | 365/205 |
| 5,923,601 A | 7/1999 | Wendell | ............... | 365/201 |
| 5,936,873 A | 8/1999 | Kongetira | ............... | 365/49 |
| 6,002,625 A | 12/1999 | Ahn | ............... | 365/206 |
| 6,002,634 A | 12/1999 | Wilson | ............... | 365/230.06 |
| 6,094,374 A | 7/2000 | Sudo | ............... | 365/185.22 |
| 6,181,621 B1 | 1/2001 | Lovett | ............... | 365/205 |
| 6,198,682 B1 | 3/2001 | Proebsting | ............... | 365/207 |
| 6,204,698 B1 | 3/2001 | Zhang | ............... | 327/55 |
| 6,208,575 B1 * | 3/2001 | Proebsting | ............... | 365/208 |
| 6,222,394 B1 | 4/2001 | Allen et al. | ............... | 327/52 |

(Continued)

*Primary Examiner*—Thong Q Le
(74) *Attorney, Agent, or Firm*—Dorsey & Whitney LLP

(57) ABSTRACT

A sense amplifier having an amplifier stage with decreased gain is described. The sense amplifier includes a first input/output ("I/O") node and a second complementary I/O node. The sense amplifier includes two amplifier stages, each for amplifying a signal on one of the I/O nodes. The first amplifier stage, having a first conductivity-type, amplifies one of the I/O node towards a first voltage. The second amplifier stage, having a second conductivity-type, amplifies the other I/O node towards a second voltage. The sense amplifier also includes a resistance circuit coupled to the second amplifier stage to reduce the gain of the second amplifier stage thereby reducing the rate of amplification of the signal on the corresponding I/O node.

77 Claims, 6 Drawing Sheets

U.S. PATENT DOCUMENTS

| | | | |
|---|---|---|---|
| 6,226,213 B1 | 5/2001 | Chih | 365/210 |
| 6,259,641 B1 | 7/2001 | Manyoki et al. | 365/205 |
| 6,304,505 B1 | 10/2001 | Forbes et al. | 365/205 |
| 6,341,093 B1 | 1/2002 | Eckert et al. | 365/201 |
| 6,373,766 B1 | 4/2002 | Birk | 365/207 |
| 6,414,521 B1 | 7/2002 | Potter et al. | 327/67 |
| 6,445,216 B1 | 9/2002 | Brueau et al. | 327/55 |
| 6,480,037 B1 | 11/2002 | Song et al. | 327/52 |
| 6,483,353 B2 * | 11/2002 | Kim et al. | 327/55 |
| 6,566,914 B2 | 5/2003 | Bruneau et al. | 327/55 |
| 6,657,909 B2 | 12/2003 | Baglin et al. | 365/205 |
| 6,661,722 B2 | 12/2003 | Lee et al. | 365/205 |
| 6,700,814 B1 | 3/2004 | Nahas et al. | 365/158 |
| 6,762,961 B2 | 7/2004 | Eleyan et al. | 365/194 |
| 6,803,794 B2 | 10/2004 | Martin et al. | 327/52 |
| 6,833,737 B2 | 12/2004 | Aipperspach | 327/55 |
| 6,903,985 B1 | 6/2005 | Wu et al. | 365/194 |
| 6,946,882 B2 | 9/2005 | Gogl et al. | 327/53 |
| 7,012,846 B2 | 3/2006 | Balasubramanian et al. | 365/205 |
| 7,019,999 B1 | 3/2006 | Srinivasan et al. | 365/49 |
| 7,020,035 B1 | 3/2006 | Eleyan et al. | 365/207 |
| 7,046,045 B2 | 5/2006 | Nakazato et al. | 327/55 |
| 7,053,668 B2 | 5/2006 | Nakazato et al. | 327/55 |
| 7,068,528 B2 | 6/2006 | Won | 365/63 |
| 7,084,672 B1 | 8/2006 | Meng et al. | 327/51 |
| 7,099,218 B2 | 8/2006 | Wicht et al. | 365/207 |
| 7,110,304 B1 | 9/2006 | Yu et al. | 365/189.02 |
| 7,126,834 B1 | 10/2006 | Meng et al. | 365/49 |
| 7,149,845 B2 | 12/2006 | Chan et al. | 711/108 |
| 7,164,612 B1 | 1/2007 | Eleyan et al. | 365/201 |
| 7,177,207 B1 | 2/2007 | Vernenker et al. | 365/194 |
| 2002/0021147 A1* | 2/2002 | Lim et al. | 327/57 |
| 2004/0125678 A1* | 7/2004 | Sinha et al. | 365/207 |
| 2007/0273435 A1* | 11/2007 | Katsunaga et al. | 327/563 |

* cited by examiner

ARRAY SENSE AMPLIFIERS, MEMORY DEVICES AND SYSTEMS INCLUDING SAME, AND METHODS OF OPERATION

TECHNICAL FIELD

This invention, in various embodiments, relates generally to integrated circuits and, more specifically, to array sense amplifiers in memory devices.

BACKGROUND OF THE INVENTION

Memory devices, such as static random access memory ("SRAM") devices and dynamic random access memory ("DRAM") devices are in common use in a wide variety of electronic systems, such as personal computers. Memory devices include one or more arrays of memory cells, which in DRAM devices, are small capacitors that are arranged in rows and columns. Data is represented by the presence or absence of a charge on the capacitor in the memory cell. Data can be stored in the memory cells during a write operation or retrieved from the memory cells during a read operation. If the capacitor in the addressed or selected memory cell is charged, then the capacitor discharges onto a digit line associated with the memory cell, which causes a change in the voltage on the digit line. On the other hand, if the capacitor in the selected memory cell is not charged, then the voltage on the digit line associated with the memory cell remains constant. The change in voltage (or lack of change) on the digit line can be detected to determine the state of the capacitor in the selected memory cell, which indicates the value of the data bit stored in the memory cell.

Sense amplifiers are used to improve the accuracy of determining the state of the capacitor in selected memory cells. As known in the art, when the memory cell array is accessed, a row of memory cells are activated, and the sense amplifiers amplify data for the respective column of memory cells by coupling each of the digit lines of the selected column to voltage supplies such that the digit lines have complementary logic levels. A conventional sense amplifier 100 of a DRAM memory array is shown in FIG. 1. The sense amplifier 100 is coupled to a pair of complementary digit lines DIGIT and DIGIT_ to which a large number of memory cells (not shown) are connected. The sense amplifier 100 includes a pair of cross-coupled PMOS transistors 102, 104. The sources of the PMOS transistors 102, 104 share a common node to which a PMOS activation signal ACT is coupled during operation. The ACT signal is typically provided by a power supply voltage (not shown) during operation. The sense amplifier 100 also includes a pair of cross-coupled NMOS transistors 112, 114. The drains of the NMOS transistors 112, 114 also share a common node to which an NMOS activation signal RNL_ is coupled during operation. The RNL_ signal is typically provided by being connected to ground (not shown) during operation. The sense amplifier 100 is configured as a pair of cross-coupled inverters in which the ACT and RNL_ signals provide power and ground, respectively. The digit lines DIGIT and DIGIT_ are additionally coupled together by an equilibration transistor 110 having a gate coupled to receive a control signal EQ.

In operation, the sense amplifier 100 equilibrates the digit lines DIGIT and DIGIT_, senses a differential voltage that develops between the digit lines DIGIT and DIGIT_, and then drives the digit lines to corresponding logic levels. In response to an active HIGH EQ signal the equilibration transistor 110 turns ON, connecting the digit lines DIGIT and DIGIT_ to each other and equilibrating the digit lines to the same voltage. The digit lines are typically equilibrated to $V_{CC}/2$, which keeps the PMOS transistors 102, 104 and the NMOS transistors 112, 114 turned OFF. After the differential voltage between the digit lines DIGIT and DIGIT_ has reached substantially zero volts, the EQ signal transitions LOW to turn OFF the transistor 110.

When a memory cell is accessed, the voltage of one of the digit lines DIGIT or DIGIT_ increases slightly, resulting in a voltage differential between the digit lines. While one digit line contains a charge from the accessed cell, the other digit line does not and serves as a reference for the sensing operation. Assuming, for example, the voltage on the DIGIT line increases, the voltage level of the DIGIT line increases slightly above $V_{CC}/2$ causing the gate-to-source voltage of the NMOS transistor 114 to be greater than the NMOS transistor 112. The RNL_ signal is activated, driving the common node of the NMOS transistors 112, 114 to ground, switching the NMOS transistor 114 ON. As a result, the complementary digit line DIGIT_ is coupled to the active RNL_ signal and is pulled to ground. In response to the low voltage level of the DIGIT_ line, the gate-to-source voltage of the PMOS transistor 102 increases, and in response to activation of the ACT signal, is turned ON due to the gate-to-source voltage being larger than the PMOS transistor 104. The DIGIT line is consequently coupled to the power supply voltage as provided by the active ACT signal, and the PMOS transistor 102 drives the digit line DIGIT towards the power supply voltage. Thereafter, the voltage on the digit line DIGIT further increases and the voltage on the complementary digit line DIGIT_ further decreases. At the end of the sensing period, the NMOS transistor 114 has driven complementary digit line DIGIT_ to ground by the active RNL_ signal and the PMOS transistor 102 has driven the digit line DIGIT to the power supply voltage $V_{CC}$ by the active ACT signal.

Random threshold voltage mismatch of transistor components in conventional sense amplifiers 100 are undesirable because deviations of the threshold voltage may abruptly cause an imbalance in the sense amplifier that can erroneously amplify input signals in the wrong direction. For example, the offset due to a threshold voltage mismatch of the sense amplifier 100 may be amplified by the large gain of the NMOS transistors 112, 114, as will be understood by one skilled in the art. Consequently, the sense amplifier 100 would likely amplify the signal on the asserted digit line incorrectly, resulting in reading the incorrect data. Errors and delays due to mismatched threshold voltages in sense amplifiers ultimately affect the overall accuracy of memory operations. While efforts have been made to compensate for threshold voltage offsets, such compensation methods typically increase memory access time, occupy chip space and increase power consumption.

Therefore, there is a need for a sense amplifier designed to have tolerance to voltage threshold mismatch of transistor components included in the sense amplifier.

DETAILED DESCRIPTION

Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
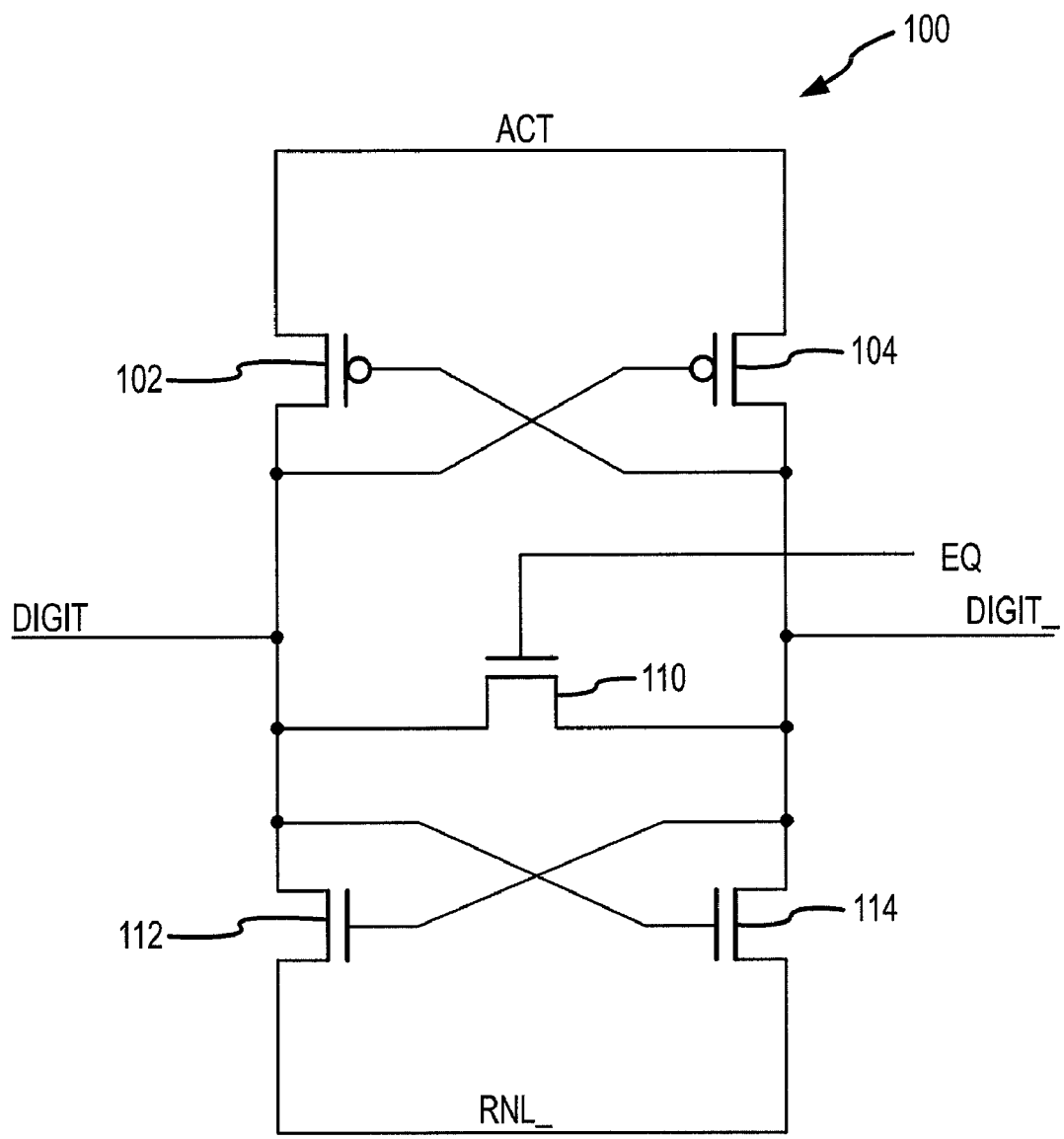
FIG. 1 is a schematic drawing of a conventional sense amplifier.
Figure 2:
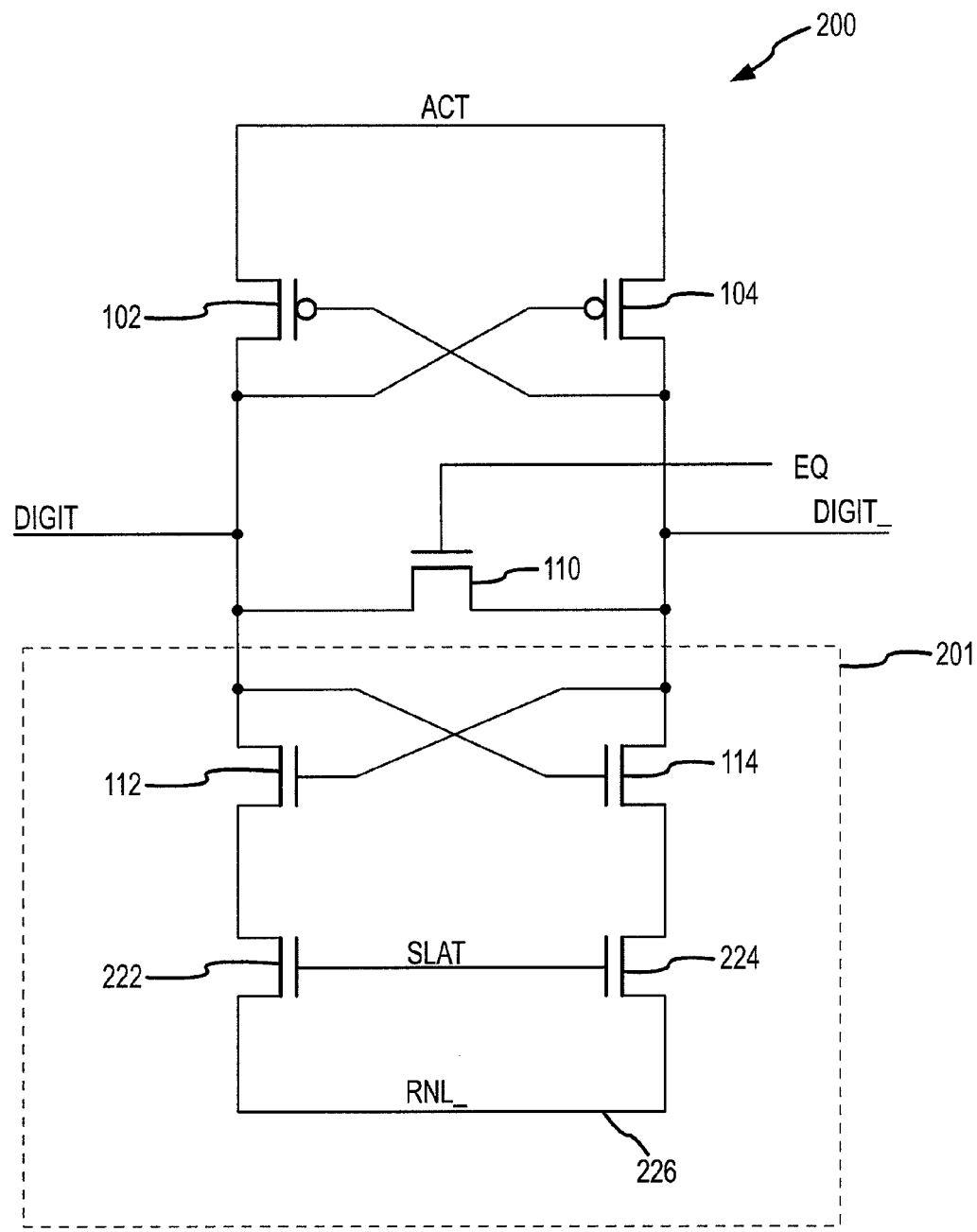
FIG. 2 is a schematic drawing of a sense amplifier according to an embodiment of the invention.

FIG. 2 illustrates a sense amplifier 200 according to an embodiment of the invention. Components and signals that were previously described with reference to FIG. 1 have been given the same reference numbers in FIG. 2. The sense amplifier 200 of FIG. 2 includes an NMOS amplifier stage 201 having a pair of NMOS transistors 222, 224 coupled to the sources of the NMOS transistors 112, 114 to provide source degeneration. The drains to each of the NMOS transistors 222, 224 are coupled to the sources of the NMOS transistors 112, 114, and the sources of the NMOS transistors 222, 224 are coupled to a common node coupled to ground. The gates of the NMOS transistors 222, 224 are coupled together and receive a control signal SLAT that provides a voltage signal to the respective gates. In the source degenerate configuration, the NMOS transistors 222, 224 provide a resistance on the sources of the NMOS transistors 112, 114. The effect of adding resistance at the NMOS amplifier stage 201 reduces the gain of the NMOS transistors 112, 114. As a result, an offset that typically would have been amplified due to a threshold voltage mismatch is reduced, which in turn minimizes its interference with amplifying the digit line signal. The resistance provided by the NMOS transistors 222, 224 may be changed by adjusting the voltage of the SLAT signal. The SLAT signal may be predetermined for the sense amplifier 200 by design or be an adjustable control signal by a user.

In operation, the DIGIT and DIGIT_ lines are precharged to Vcc/2 and the voltages of the digit lines are equilibrated by activating the EQ signal and coupling the two digit lines together through the transistor 110. The EQ signal is then deactivated to isolate the DIGIT and DIGIT_ lines in preparation for a sense operation. A word line (not shown) of the memory cell array is activated to couple a row of memory cells to a respective digit line and to a respective sense amplifier 200. As previously described, coupling a memory cell to the respective digit line causes a voltage differential between the DIGIT and DIGIT_ lines. In the present example, it will be assumed that the accessed memory cell is coupled to the DIGIT line and increases the voltage to slightly above Vcc/2. As a result, the gate-to-source voltage of the NMOS transistor 114 is greater than for the NMOS transistor 112.

Prior to activation of the RNL_ and ACT signals, the SLAT signal is activated to couple the sources of the transistors 112, 114 to a common node 226 through the transistors 222, 224. As a result, voltage of both the DIGIT and DIGIT_ lines slightly decrease. With the greater gate-to-source voltage for the NMOS transistor 114, the voltage of the DIGIT_ line is discharged more quickly to the common node 226 than for the DIGIT line, resulting in the PMOS transistor 102 having a greater gate-to-source voltage than for the PMOS transistor 104. The ACT signal is then activated (typically providing Vcc, a power supply voltage), and due to the greater gate-to-source voltage of the PMOS transistor 102, the transistor 102 begins to switch ON before the PMOS transistor 104, further increasing the gate-to-source voltage of the NMOS transistor 114. The RNL_ signal is activated coupling the sources of the NMOS transistors 112, 114 to ground, fully switching ON the transistor 114 and fully coupling the DIGIT_ line to ground. The PMOS transistor 102 is consequently fully switching ON by the grounded DIGIT_ line and fully couples the DIGIT line to Vcc, latching the DIGIT and DIGIT_ lines to respective voltages Vcc and ground.

As previously discussed, the transistors 222, 224 increase the source-to-ground resistance of the NMOS transistors 112, 114 to provide source degeneration and reduce the gain of the NMOS transistors 112, 114. The trade-off for reducing the gain of the NMOS transistors 112, 114 is that the current gain is also reduced, which slows the amplification of the DIGIT and DIGIT_ lines. The slower amplification of the NMOS amplifier stage 201 allows time for the PMOS transistors 102, 104 to recover towards Vcc before the NMOS transistors 112, 114 are fully driven to ground. As a result, failure to pull-up the voltage of one of the digit lines due to transistor threshold voltage mismatch is reduced during normal operation of the sense amplifier 200.

Figure 3:
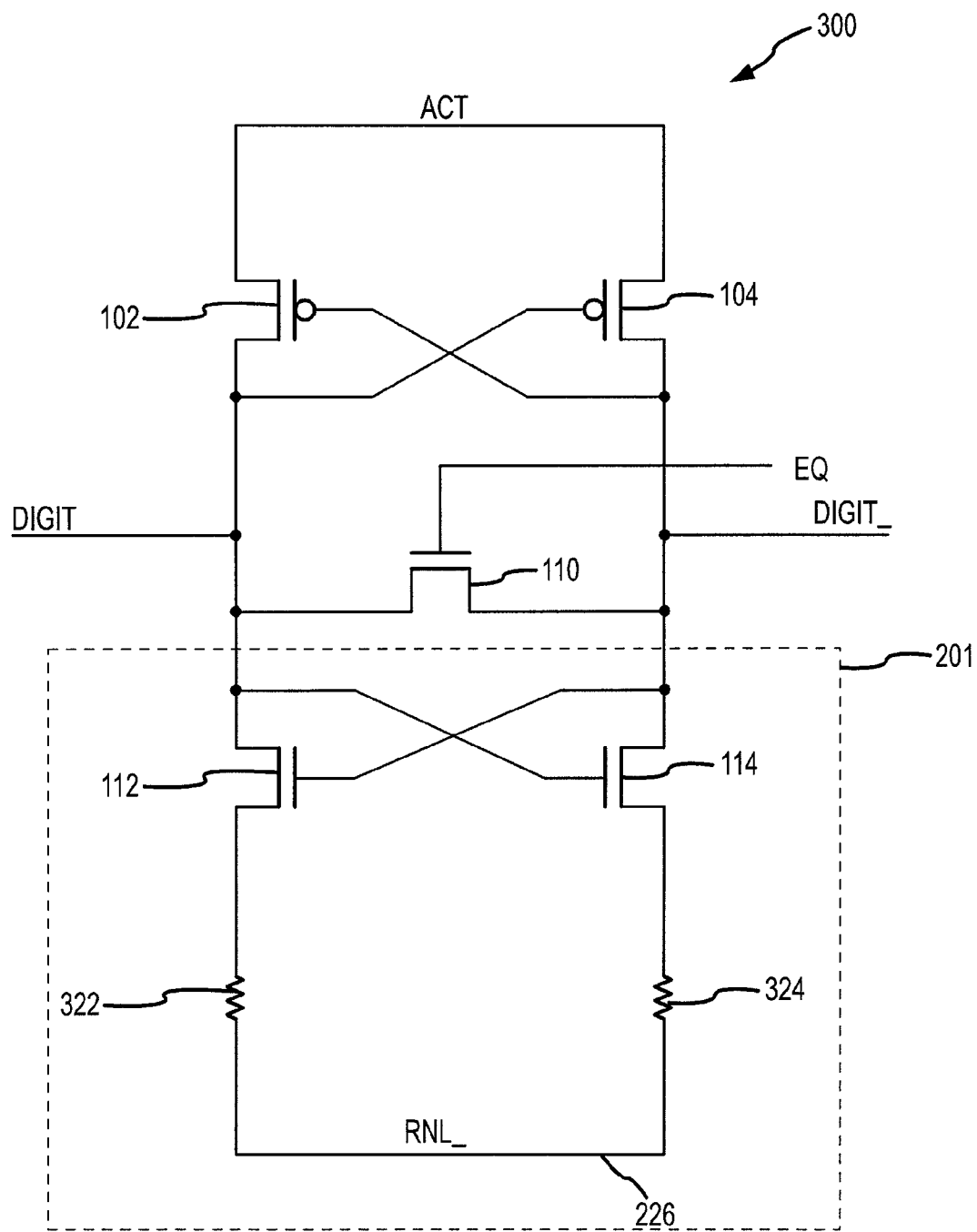
FIG. 3 is a schematic drawing of a sense amplifier according to another embodiment of the invention.

FIG. 3 illustrates a sense amplifier 300 according to another embodiment of the invention. The sense amplifier 300 is similar to the sense amplifier 200 previously described with reference to FIG. 2. The transistors 222, 224 of the sense amplifier 200, however, have been replaced in the sense amplifier 300 with resistors 322, 324. As previously discussed, the transistors 222, 224 increased the source-to-ground resistance of the NMOS transistors 112, 114 to provide source degeneration. The resistors 322, 324 are used to provide increased source-to-ground resistance in place of the transistors 222, 224. Operation of the sense amplifier 300 is the same as for the sense amplifier 200 except that provision of an active SLAT signal is not necessary.

Figure 4:
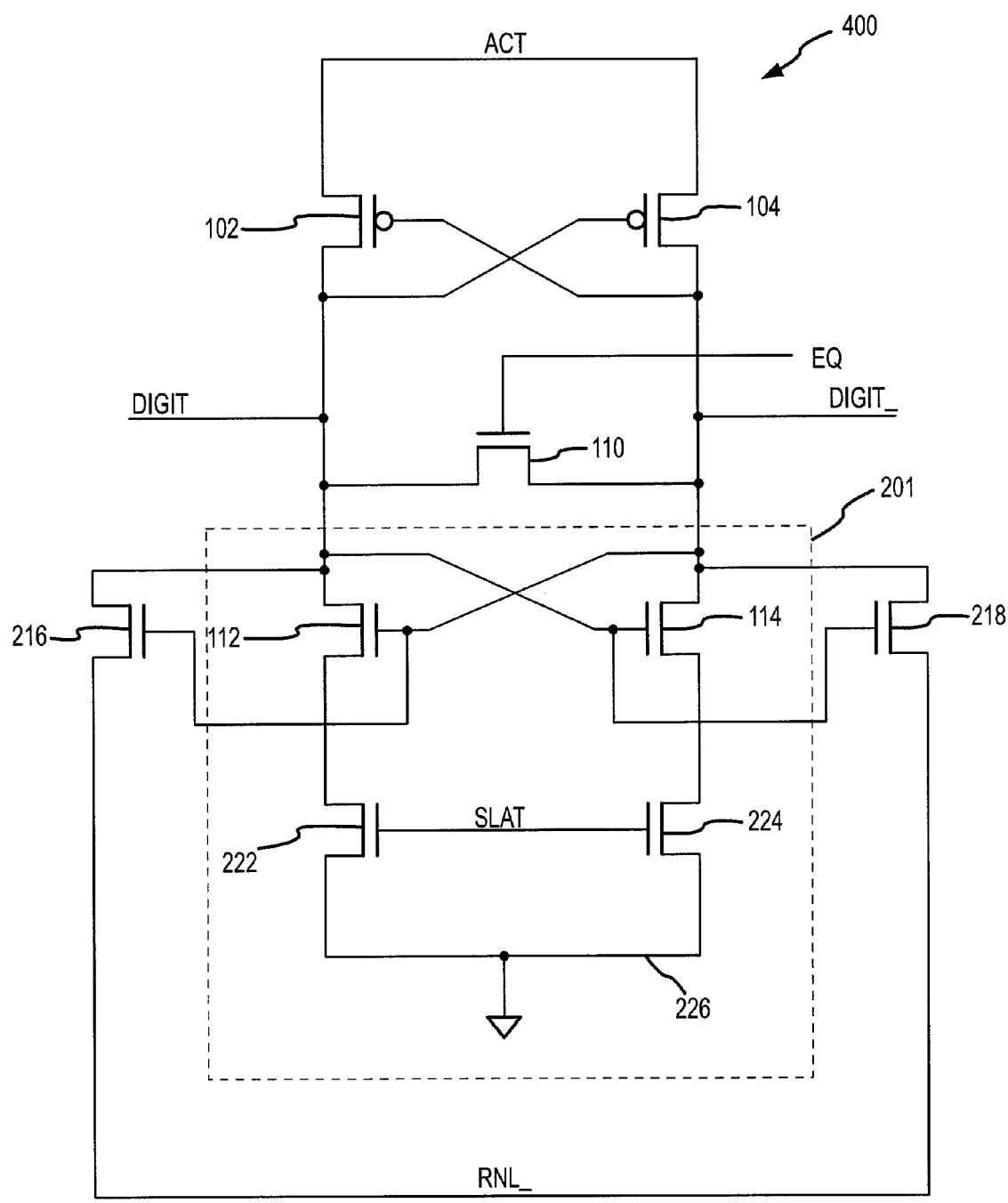
FIG. 4 is a schematic drawing of a sense amplifier according to another embodiment of the invention.

FIG. 4 illustrates a sense amplifier 400 according to another embodiment of the invention. The sense amplifier 400 is similar to the sense amplifier 200 previously described with reference to FIG. 2. However, additional NMOS transistors 216, 218 are included in the sense amplifier 400 and the common node 226 is coupled to ground. The NMOS transistors 216, 218 are used to enhance pull-down of the DIGIT and DIGIT_ lines to ground during sensing. The drains of the NMOS transistors 216, 218 are coupled to the respective drains of the NMOS transistors 112, 114, and the gates of the NMOS transistors 216, 218 are also respectively coupled to the gates of the NMOS transistors 112, 114. The sources of the NMOS transistors 216, 218 are coupled together and share a common node to which the RNL_ signal is coupled.

Operation of the sense amplifier 400 is similar to operation of the sense amplifier 200. The increase of gate-to-source voltage of one of the NMOS transistors 112, 114 in response to coupling a memory cell to either the DIGIT or DIGIT_ line also increases the gate-to-source voltage of one of the NMOS transistors 216, 218. With the common node 226 coupled to ground, rather than to receive the RNL_ signal, the voltage of the DIGIT and DIGIT_ lines begin to discharge to ground immediately rather than waiting for the RNL_ signal to become active. As previously discussed with reference to the sense amplifier 200, the decreasing voltage of the DIGIT or DIGIT_ line creates a gate-to-source voltage imbalance between the PMOS transistors 102, 104, with one of the two transistors switching ON before the other in response to the ACT signal becoming active. In addition to causing either of the NMOS transistors 112, 114 to switch ON more fully, the corresponding NMOS transistors 216, 218 is more fully switched ON as well. In response to the RNL_ signal becoming active, the conductive NMOS transistor 216 or 218 provides additional drive capability to pull-down the DIGIT or DIGIT_ line to ground more quickly than compared to the sense amplifier 200.

In another embodiment, the sense amplifier 300 of FIG. 3 is modified to includes additional transistors to provide greater drive capability to pull-down the DIGIT or DIGIT_ line, as previously discussed with reference to the sense amplifier 400 of FIG. 4. Resistors, multiple transistors, impedances sources or any other components, or combinations thereof may be used in place of the NMOS transistors 222, 224, as is known in the art, to provide source degeneration and reduce the gain of the NMOS transistors 1112, 114.

The sense amplifiers 200, 300, and 400 were previously described in operation according to a particular activation sequence of signals, for example, the EQ, SLAT, ACT, and RNL_ signals. In other embodiments of the invention, the activation sequence of signals is different than that previously described. Those ordinarily skilled in the art will obtain sufficient understanding from the description provided herein to make such modifications to practice these other embodiments. The present invention is not limited to the particular sequence previously described for the previously described embodiments of the invention.

Figure 5:
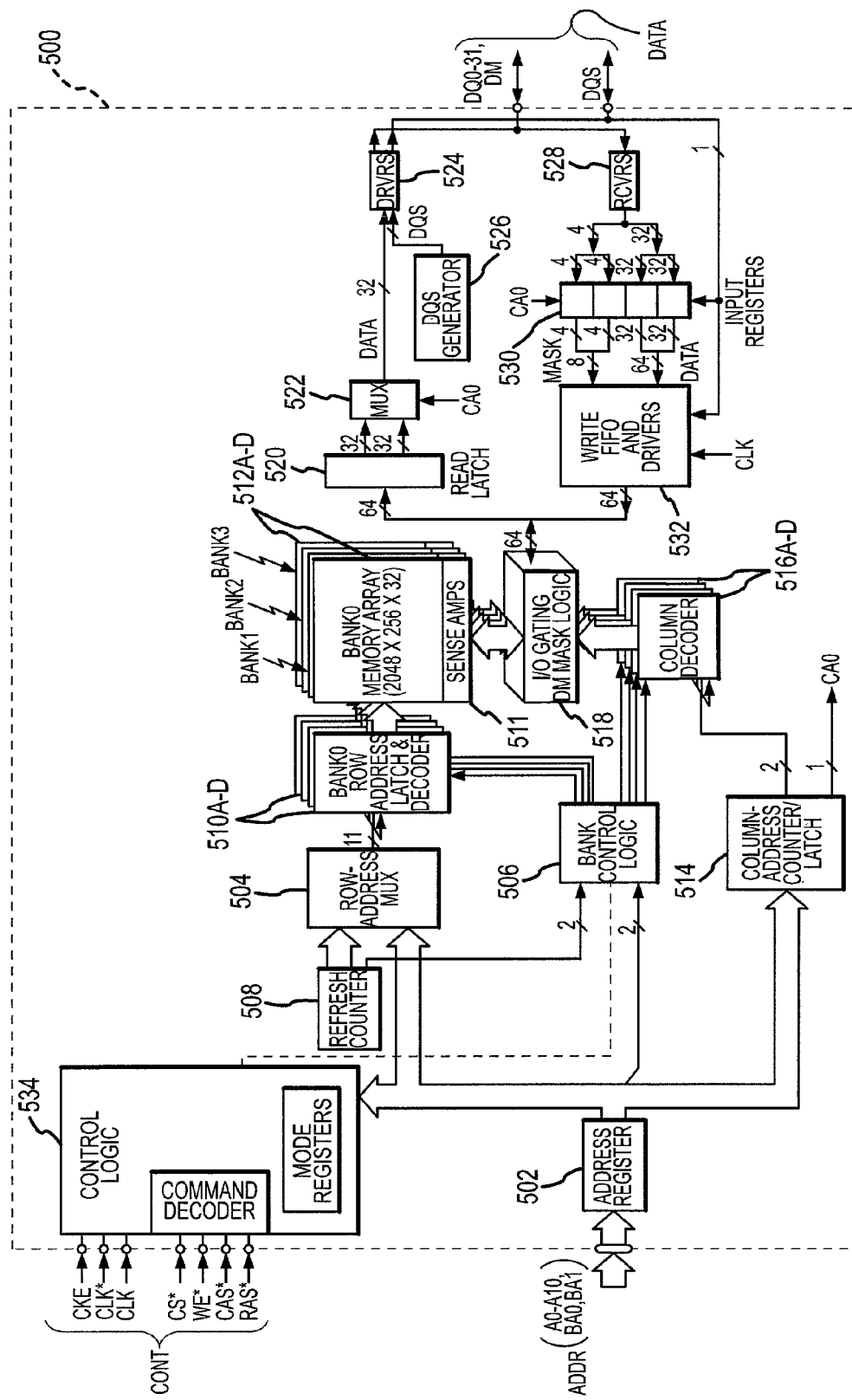
FIG. 5 is a functional block diagram of a memory device including a sense amplifier according to an embodiment of the invention.

FIG. 5 illustrates an embodiment of a memory device 500 including at least one sense amplifier according to an embodiment of the present invention. The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address.

In response to the decoded row address, the activated row address latch and decoder 510A-D applies various signals to a corresponding memory bank 512A-D, including a row activation signal to activate a row of memory cells corresponding to the decoded row address. Each memory bank 512A-D includes a memory-cell array having a plurality of memory cells arranged in rows and columns. Data stored in the memory cells in the activated row are sensed and amplified by sense amplifiers 511 in the corresponding memory bank. The sense amplifiers 511 are designed according to an embodiment of the present invention. The row address multiplexer 504 applies the refresh row address from the refresh counter 508 to the decoders 510A-D and the bank control logic circuit 506 uses the refresh bank address from the refresh counter when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. In the embodiment of FIG. 3, the circuit 518 provides 64 bits to the read latch 520 which, in turn, provides two 32 bits words to the multiplexer 522. A data driver 524 sequentially receives the N/2 bit words from the multiplexer 522 and also receives a data strobe signal DQS from a strobe signal generator 526. The DQS signal is used by an external circuit such as a memory controller (not shown) in latching data from the memory device 500 during read operations. The data driver 524 sequentially outputs the received N/2 bits words as a corresponding data word DQ, each data word being output in synchronism with a rising or falling edge of a CLK signal that is applied to clock the memory device 500. The data driver 524 also outputs the data strobe signal DQS having rising and falling edges in synchronism with rising and falling edges of the CLK signal, respectively. Each data word DQ and the data strobe signal DQS collectively define a data bus DATA.

During data write operations, an external circuit such as a memory controller (not shown) applies N/2 bit data words DQ, the strobe signal DQS, and corresponding data masking signals DM on the data bus DATA. A data receiver 528 receives each DQ word and the associated DM signals, and applies these signals to input registers 530 that are clocked by the DQS signal. In response to a rising edge of the DQS signal, the input registers 530 latch a first N/2 bit DQ word and the associated DM signals, and in response to a falling edge of the DQS signal the input registers latch the second N/2 bit DQ word and associated DM signals. The input register 530 provides the two latched N/2 bit DQ words as an N-bit word to a write FIFO and driver 532, which clocks the applied DQ word and DM signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signals CLK, CLK*. The command decoder 534 latches command and address signals at positive edges of the CLK, CLK* signals (i.e., the crossing point of CLK going high and CLK* going low), while the input registers 530 and data drivers 524 transfer data into and from, respectively, the memory device 500 in response the data strobe signal DQS. The detailed operation of the control logic and command decoder 534 in generating the control and timing signals is conventional, and thus, for the sake of brevity, will not be described in more detail. Although previously described with respect to a dynamic random access memory device, embodiments of the present invention can be utilized in applications other than for a memory device where it is desirable to reduce the effects a threshold voltage mismatch when the voltage level of an input signal is amplified.

Figure 6:
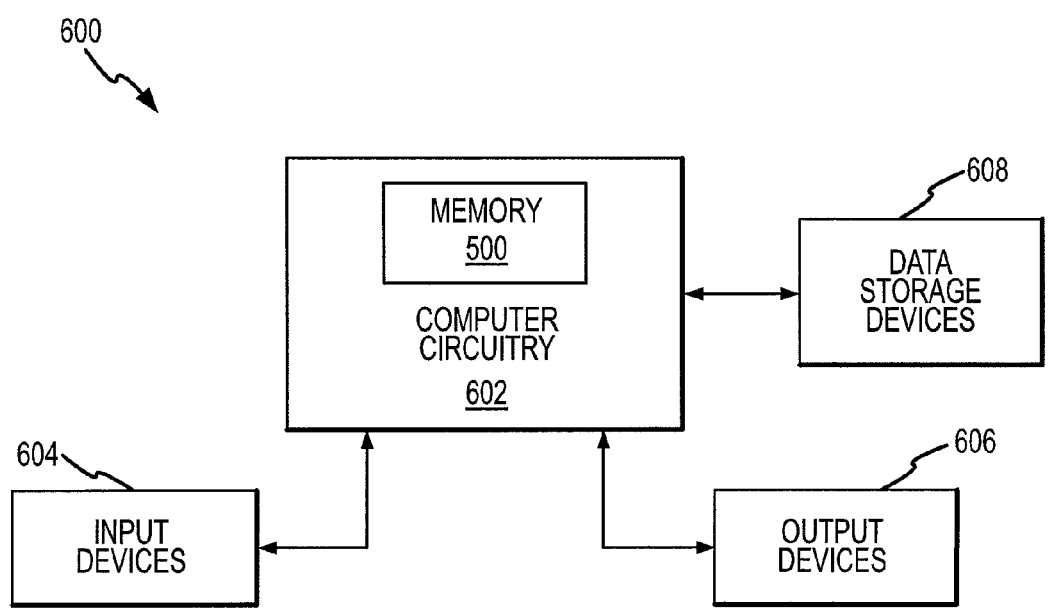
FIG. 6 is a functional block diagram of a computer system including the memory device of FIG. 5.

FIG. 6 is a block diagram of a computer system 600 including computer circuitry 602 including the memory device 500 of FIG. 5. Typically, the computer circuitry 602 is coupled through address, data, and control buses to the memory device 500 to provide for writing data to and reading data from the memory device. The computer circuitry 602 includes circuitry for performing various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. The computer system 600 may include one or more output devices 606 coupled to the computer circuitry 602, such as output devices typically including a printer and a video terminal. One or more data storage devices 608 may also be coupled to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. A sense amplifier comprising:
    a first input/output ("I/O") node and a second I/O node complementary to the first I/O node;
    a first amplifier stage operable to couple the first I/O node to a first voltage and amplify a first I/O node signal to the first voltage;
    a second amplifier stage operable to couple the second I/O node to a second voltage and amplify a second I/O node signal to the second voltage; and
    a resistance circuit coupled to the second amplifier stage and configured to reduce the gain of the second amplifier stage to slow the rate of amplification of the second I/O node signal, the resistance circuit comprising two NMOS transistors configured to provide a resistance, the two NMOS transistors having gates coupled together to receive a control signal to provide the resistance.

2. The sense amplifier of claim 1 wherein the resistance circuit comprises two resistors.

3. The sense amplifier of claim 1 wherein the first amplifier stage comprises cross-coupled PMOS transistors.

4. The sense amplifier of claim 1 wherein the second amplifier stage comprises cross-coupled NMOS transistors.

5. The sense amplifier of claim 4 further comprising a driver circuit coupled to the second amplifier stage and operable to increase the drive of the respectively coupled I/O node toward the second voltage.

6. The sense amplifier of claim 5 wherein the driver circuit further comprises a pair NMOS transistors respectively coupled to each of the NMOS transistors of the second amplifier stage.

7. The sense amplifier of claim 1 further comprising an equilibrium circuit coupled to the first and second I/O nodes, and configured to receive a control signal for precharging the first and second I/O nodes to the same voltage.

8. The sense amplifier of claim 7 wherein the equilibrium circuit comprises an NMOS transistor.

9. The sense amplifier of claim 1 wherein the first voltage comprises a power supply voltage and the second voltage comprises ground.

10. An amplifier for sensing a differential voltage comprising:
    a precharge switch coupled to a pair of output terminals and configured to precharge the pair of output terminals to the same voltage level;
    a first pair of transistors cross-coupled to each other and to the pair of output terminals respectively, each transistor of the first pair operable to couple one of the pair of output terminals to a first voltage;
    a second pair of transistors cross-coupled to each other and to the pair of output terminals respectively, each transistor of the second pair operable to couple one of the pair of output terminals to a second voltage; and
    a resistance circuit coupled to the second pair of transistors and to a ground source, the resistance circuit configured to reduce the gain of the second pair of transistors.

11. The amplifier of claim 10 wherein the second pair of transistors is configured to amplify a voltage differential between the output terminals.

12. The amplifier of claim 10 wherein the precharge switch is further configured to precharge the pair of output terminals to a voltage level VCC/2.

13. The amplifier of claim 10 wherein the first pair of transistors comprises cross-coupled PMOS transistors.

14. The amplifier of claim 13 wherein the second pair of transistors comprises cross-coupled NMOS transistors.

15. The amplifier of claim 14 further comprising a driver circuit coupled to the second pair of transistors, the driver circuit operable to increase drive of the respectively coupled output terminal towards the second voltage.

16. The amplifier of claim 15 wherein the driver circuit further comprises a pair of NMOS transistors respectively coupled to each of the cross-coupled NMOS transistors of the second pair of transistors.

17. The amplifier of claim 10 wherein the precharge switch comprises an NMOS transistor.

18. The amplifier of claim 10 wherein the first voltage is VCC and the second voltage is ground.

19. The amplifier of claim 10 wherein the resistance circuit further comprises two NMOS transistors having gates coupled together to receive a control signal for controlling an n-channel resistance of the transistors.

20. The amplifier of claim 10 wherein the resistance circuit comprises two resistors.

21. A sense amplifier for sensing a differential voltage between a pair of complementary digit lines comprising:
   a first sense line and a second sense line complementary to the first sense line;
   a precharge NMOS transistor coupled to the first and second sense lines, and further having a gate configured to receive a precharge control signal for equilibrating the first and second sense lines to the same voltage level;
   a first sense amplifier stage comprising a pair of PMOS transistors cross-coupled to the first and second sense lines respectively, and further being coupled to a first voltage supply, the pair of PMOS transistors operable to amplify the first sense line towards the first voltage supply; and
   a second sense amplifier stage comprising:
   a first pair of NMOS transistors cross-coupled to the first and second sense lines respectively, and further coupled to the pair of PMOS transistors;
   a second pair of NMOS transistors coupled to the first pair of NMOS transistors and to a second voltage supply, and further having its gates coupled to each other to receive a latch control signal, the second pair of NMOS transistors operable to adjust the gain of the second sense amplifier stage responsive to the latch control signal, wherein the first and second pair of NMOS transistors are further operable to amplify the second sense line towards the second voltage supply; and
   a third pair of NMOS transistors, each transistor correspondingly coupled to each of the first pair of NMOS transistors and to the second voltage supply, the third pair of NMOS transistors configured to increase the signal drive of the second sense amplifier stage.

22. The sense amplifier of claim 21 wherein the first voltage supply comprises VCC and the second voltage supply comprises ground.

23. The sense amplifier of claim 22 wherein the first amplifier stage is further operable to drive the signal applied on first sense line towards VCC, and the second amplifier stage is further operable to drive the signal applied on the second sense line towards ground.

24. The sense amplifier of claim 21 wherein the precharge NMOS transistor is further configured to equilibrate the first and second sense lines to VCC/2.

25. The sense amplifier of claim 21 wherein the latch control signal further comprises receiving a voltage signal for controlling the resistance across the n-channel of the second pair of NMOS transistors.

26. A memory device, comprising:
   an address bus;
   a control bus;
   a data bus;
   an address decoder coupled to the address bus;
   a read/write circuit coupled to the data bus;
   a control circuit coupled to the control bus;
   an array of memory cells coupled to the address decoder, control circuit, and read/write circuit; and
   a plurality of sense amplifier coupled to the array of memory cells, each sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage; and
   a resistance circuit coupled to the second amplifier stage and configured to reduce the gain of the second amplifier stage to slow the rate of amplification of the second I/O node signal, the resistance circuit comprising two NMOS transistors configured to provide a resistance, the two NMOS transistors having gates coupled together to receive a control signal to provide the resistance.

27. The memory device of claim 26 wherein the resistance circuit comprises two resistors.

28. The memory device of claim 26 wherein the first amplifier stage comprises cross-coupled PMOS transistors.

29. The memory device of claim 26 wherein the second amplifier stage comprises cross-coupled NMOS transistors.

30. The memory device of claim 29 wherein the sense amplifier further comprises a driver circuit coupled to the second amplifier stage and operable to increase the drive of the respectively coupled I/O node towards the second voltage.

31. The memory device of claim 30 wherein the driver circuit further comprises a pair NMOS transistors respectively coupled to each of the NMOS transistors of the second amplifier stage.

32. The memory device of claim 26 wherein the first voltage comprises a power supply voltage and the second voltage comprises ground.

33. The memory device of claim 26 wherein the sense amplifier further comprises an equilibrium circuit coupled to the first and second I/O nodes, and configured to receive a control signal for precharging the first and second I/O nodes to the same voltage.

34. The memory device of claim 33 wherein the equilibrium circuit comprises an NMOS transistor.

35. The memory device of claim 33 wherein the equilibrium circuit precharges the first and second I/O nodes towards VCC/2.

36. A computer system, comprising:
   a data input device;
   a data output device;
   a processor coupled to the data input and output devices; and
   a memory device coupled to the processor, comprising:
   an address bus;
   a control bus;
   a data bus;
   an address decoder coupled to the address bus;
   a read/write circuit coupled to the data bus;
   a control circuit coupled to the control bus;
   an array of memory cells coupled to the address decoder, control circuit, and read/write circuit; and
   a plurality of sense amplifier coupled to the array of memory cells, each sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage; and
   a resistance circuit coupled to the second amplifier stage and configured to reduce the gain of the second amplifier stage to slow the rate of amplification of the second I/O node signal, the resistance circuit comprising two NMOS transistors configured to provide a resistance, the two NMOS transistors having gates coupled together to receive a control signal to provide the resistance.

37. The computer system of claim 36 wherein the resistance circuit comprises two resistors.

38. The computer system of claim 36 wherein the first amplifier stage comprises cross-coupled PMOS transistors.

39. The computer system of claim 36 wherein the second amplifier stage comprises cross-coupled NMOS transistors.

40. The computer system of claim 39 wherein the sense amplifier further comprising a driver circuit coupled to the second amplifier stage and operable to increase the drive of the respectively coupled I/O node towards the second voltage.

41. The computer system of claim 40 wherein the driver circuit further comprises a pair NMOS transistors respectively coupled to each of the NMOS transistors of the second amplifier stage.

42. The computer system of claim 36 wherein the first voltage comprises a power supply voltage and the second voltage comprises ground.

43. The computer system of claim 36 wherein the sense amplifier further comprising an equilibrium circuit coupled to the first and second I/O nodes, and configured to receive a control signal for precharging the first and second I/O nodes to the same voltage.

44. The computer system of claim 43 wherein the equilibrium circuit comprises an NMOS transistor.

45. The computer system of claim 44 wherein the equilibrium circuit precharges the first and second I/O nodes towards VCC/2.

46. A method of sensing a differential voltage between first and second digit lines that are complementary, the method comprising:
   activating a first amplifier in response to a received signal on the first digit line to drive a signal on the second digit line;
   reducing the gain of the first amplifier to slow the amplification of the signal on the second digit line;
   activating a second amplifier to inversely amplify the received signal on the first digit line; and
   generating complementary output signals indicative of the amplification of signals on the first and second digit lines.

47. The method of claim 46 wherein activating the first amplifier comprises driving the received signal on the first digit line through at least one NMOS transistor, and activating the second amplifier comprises driving the signal on the second digit line through at least one PMOS transistor.

48. The method of claim 47 wherein driving the received signal on the first digit line further comprises driving the received signal towards ground, and driving the received signal on the second digit line further comprises driving the received signal towards VCC.

49. The method of claim 48 wherein reducing the gain of the first amplifier comprises coupling a resistance in series with the at least one NMOS transistor of the first amplifier.

50. The method of claim 49 wherein coupling a resistance in series with the at least one NMOS transistor comprises coupling an NMOS transistor configured receive a control signal at its gate and operable to provide an resistance across the n-channel between its drain and source.

51. The method of claim 47 wherein activating the second amplifier further comprising increasing the drive of the signal on the second digit line by coupling an NMOS drive transistor to the at least one NMOS transistor of the first amplifier.

52. The method of claim 46 further comprising precharging the first and second digit lines to an equal signal level before activating the first amplifier.

53. The method of claim 52 wherein precharging the first and second digit lines comprises coupling an NMOS transistor to the first and second digit lines configured to receive a precharge control signal.

54. A method of sensing a differential voltage between a pair of complementary digit lines comprising:
   precharging the pair of complementary digit lines to the same signal level;
   receiving a first signal on a first digit line of the pair of digit lines;
   amplifying a second signal on a second digit line of the pair of digit lines;
   applying a resistance to slow the amplification of the second signal;
   amplifying the first signal received on the first digit line to a polarity opposite the polarity of the second signal and in response to the amplification of the second signal on the second digit line; and
   outputting complementary digital signals on each of the respective digit lines.

55. The method of claim 54 wherein amplifying the second signal comprises activating at least one NMOS transistor in response to the received first signal, and amplifying the second signal comprises activating at least one PMOS transistor in response to the amplified second signal.

56. The method of claim 55 wherein amplifying the first signal comprises driving the received first signal towards VCC, and amplifying the second signal comprises driving the second signal towards ground.

57. The method of claim 54 wherein applying a resistance to slow the amplification of the second signal comprises driving the second signal across a resistor in series with the at least one NMOS transistor.

58. The method of claim 54 wherein applying a resistance to slow the amplification of the second signal comprises driving the second signal through an NMOS transistor having a resistive n-channel between its drain and source.

59. The method of claim 54 wherein amplifying the second signal on the second digit line further comprises increasing the drive of the second signal by driving the signal through an NMOS drive transistor.

60. The method of claim 54 wherein precharging the first and second digit lines comprises coupling the drain and source of an NMOS equilibrium transistor to the first and second digit lines, and configuring its gate to receive a precharge control signal.

61. A sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage, the second stage comprising cross-coupled NMOS transistors; and
   a resistance circuit coupled to the second amplifier stage and configured to reduce the gain of the second amplifier stage to slow the rate of amplification of the second I/O node signal.

62. The sense amplifier of claim 61 further comprising a driver circuit coupled to the second amplifier stage and operable to increase the drive of the respectively coupled I/O node toward the second voltage.

63. The sense amplifier of claim 62 wherein the driver circuit further comprises a pair NMOS transistors respectively coupled to each of the NMOS transistors of the second amplifier stage.

64. A sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage;
   a resistance circuit coupled to the second amplifier stage and configured to reduce the gain of the second amplifier stage to slow the rate of amplification of the second I/O node signal; and
   an equilibrium circuit coupled to the first and second I/O nodes, and configured to receive a control signal for precharging the first and second I/O nodes to the same voltage.

65. The sense amplifier of claim 64 wherein the equilibrium circuit comprises an NMOS transistor.

66. A memory device, comprising:
   an address bus;
   a control bus;
   a data bus;
   an address decoder coupled to the address bus;
   a read/write circuit coupled to the data bus;
   a control circuit coupled to the control bus;
   an array of memory cells coupled to the address decoder, control circuit, and read/write circuit; and
   a plurality of sense amplifier coupled to the array of memory cells, each sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage, the second amplifier stage comprising cross-coupled NMOS transistors; and
   a resistance circuit coupled to the second amplifier stage and configured to reduce the gain of the second amplifier stage to slow the rate of amplification of the second I/O node signal.

67. The memory device of claim 66 wherein the sense amplifier further comprises a driver circuit coupled to the second amplifier stage and operable to increase the drive of the respectively coupled I/O node towards the second voltage.

68. The memory device of claim 67 wherein the driver circuit further comprises a pair NMOS transistors respectively coupled to each of the NMOS transistors of the second amplifier stage.

69. A memory device, comprising:
   an address bus;
   a control bus;
   a data bus;
   an address decoder coupled to the address bus;
   a read/write circuit coupled to the data bus;
   a control circuit coupled to the control bus;
   an array of memory cells coupled to the address decoder, control circuit, and read/write circuit; and
   a plurality of sense amplifier coupled to the array of memory cells, each sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage;
   a resistance circuit coupled to the second amplifier stage and configured to reduce the gain of the second amplifier stage to slow the rate of amplification of the second I/O node signal; and
   an equilibrium circuit coupled to the first and second I/O nodes, and configured to receive a control signal for precharging the first and second I/O nodes to the same voltage.

70. The memory device of claim 69 wherein the equilibrium circuit comprises an NMOS transistor.

71. The memory device of claim 69 wherein the equilibrium circuit precharges the first and second I/O nodes towards VCC/2.

72. A computer system, comprising:
   a data input device;
   a data output device;
   a processor coupled to the data input and output devices; and
   a memory device coupled to the processor, comprising:
   an address bus;
   a control bus;
   a data bus;
   an address decoder coupled to the address bus;
   a read/write circuit coupled to the data bus;
   a control circuit coupled to the control bus;
   an array of memory cells coupled to the address decoder, control circuit, and read/write circuit; and
   a plurality of sense amplifier coupled to the array of memory cells, each sense amplifier comprising:
   a first input/output ("I/O") node and a second I/O node complementary to the first I/O node;
   a first amplifier stage operable to couple the first I/O node to a first voltage and amplify a first I/O node signal to the first voltage;
   a second amplifier stage operable to couple the second I/O node to a second voltage and amplify a second I/O node signal to the second voltage, the second amplifier stage comprising cross-coupled NMOS transistors; and
   a resistance circuit coupled to the second amplifier stage and configured to reduce the gain of the second amplifier stage to slow the rate of amplification of the second I/O node signal.

73. The computer system of claim 72 wherein the sense amplifier further comprising a driver circuit coupled to the second amplifier stage and operable to increase the drive of the respectively coupled I/O node towards the second voltage.

74. The computer system of claim 73 wherein the driver circuit further comprises a pair NMOS transistors respectively coupled to each of the NMOS transistors of the second amplifier stage.

75. A computer system, comprising:
   a data input device;
   a data output device;
   a processor coupled to the data input and output devices; and
   a memory device coupled to the processor, comprising:
   an address bus;
   a control bus;
   a data bus;

an address decoder coupled to the address bus;
a read/write circuit coupled to the data bus;
a control circuit coupled to the control bus;
an array of memory cells coupled to the address decoder, control circuit, and read/write circuit; and
a plurality of sense amplifier coupled to the array of memory cells, each sense amplifier comprising:
a first input/output ("I/O") node and a second I/O node complementary to the first I/O node;
a first amplifier stage operable to couple the first I/O node to a first voltage and amplify a first I/O node signal to the first voltage;
a second amplifier stage operable to couple the second I/O node to a second voltage and amplify a second I/O node signal to the second voltage;
a resistance circuit coupled to the second amplifier stage and configured to reduce the gain of the second amplifier stage to slow the rate of amplification of the second I/O node signal; and
an equilibrium circuit coupled to the first and second I/O nodes, and configured to receive a control signal for precharging the first and second I/O nodes to the same voltage.

76. The computer system of claim 75 wherein the equilibrium circuit comprises an NMOS transistor.

77. The computer system of claim 76 wherein the equilibrium circuit precharges the first and second I/O nodes towards VCC/2.

* * * * *